(12) United States Patent
Kimura et al.

(10) Patent No.: US 8,305,171 B2
(45) Date of Patent: Nov. 6, 2012

(54) ROTARY SWITCH AND ELECTRONIC TIMEPIECE

(75) Inventors: Soh Kimura, Kodaira (JP); Syuuichi Machida, Ome (JP)

(73) Assignee: Casio Computer Co., Ltd., Tokyo (JP)

( * ) Notice: Subject to any disclaimer, the term of this patent is extended or adjusted under 35 U.S.C. 154(b) by 392 days.

(21) Appl. No.: 12/618,918

(22) Filed: Nov. 16, 2009

(65) Prior Publication Data
US 2010/0142331 A1 Jun. 10, 2010

(30) Foreign Application Priority Data
Dec. 9, 2008 (JP) .................................. 2008-313194

(51) Int. Cl.
*H01H 9/00* (2006.01)
(52) U.S. Cl. ........................................ 335/205; 335/207
(58) Field of Classification Search .................. 335/205
See application file for complete search history.

(56) References Cited

U.S. PATENT DOCUMENTS

| | | | | |
|---|---|---|---|---|
| 4,853,909 A * | 8/1989 | Shoji et al. | ................. | 368/190 |
| 6,134,189 A | 10/2000 | Carrard | | |
| 6,900,713 B2 * | 5/2005 | Kasashima et al. | .......... | 335/207 |
| 7,016,263 B2 * | 3/2006 | Gueissaz et al. | .............. | 368/10 |
| 7,275,860 B2 * | 10/2007 | Hirano et al. | ................. | 368/191 |
| 7,404,667 B2 * | 7/2008 | Born et al. | ................... | 368/190 |
| 7,520,664 B2 * | 4/2009 | Wai | ............... | 368/190 |
| 2004/0100440 A1 | 5/2004 | Levin et al. | | |
| 2008/0112275 A1 | 5/2008 | Born et al. | | |

FOREIGN PATENT DOCUMENTS

| | | |
|---|---|---|
| FR | 2 763 710 A1 | 11/1998 |
| JP | 60-78547 U | 5/1985 |
| JP | 2008-122377 A | 5/2008 |

OTHER PUBLICATIONS

Extended European Search Report (EESR) dated Jan. 25, 2011 (in English) in counterpart European Application No. 09178193.0.

* cited by examiner

*Primary Examiner* — Elvin G Enad
*Assistant Examiner* — Lisa Homza
(74) *Attorney, Agent, or Firm* — Holtz, Holtz, Goodman & Chick, PC

(57) ABSTRACT

A rotary switch includes an operating member, a magnet member, and a magnetic sensor. The operating member is operable from outside of a case to move to first and second positions in an axial direction and is rotatable. The magnet member is provided in such a manner that the magnet member does not move in the axial direction of the operating member. The magnetic sensor detects rotation of the magnet member. An engaging section is formed in a predetermined area of the operating member, and an engaging hole to receive the engaging section is formed in the magnet member. When the operating member is moved in the axial direction, the engaging section moves inside the engaging hole with the engaging section being engaged with the engaging hole, and when the operating member is rotated, the magnet member rotates therewith.

18 Claims, 13 Drawing Sheets

ROTARY SWITCH AND ELECTRONIC TIMEPIECE

CROSS-REFERENCE TO RELATED APPLICATION

This application is based upon and claims the benefit of priority from the prior Japanese Patent Application No. 2008-313194, filed Dec. 9, 2008, the entire contents of which is incorporated herein by reference.

BACKGROUND OF THE INVENTION

1. Field of the Invention

The present invention relates to a rotary switch and an electronic timepiece.

2. Description of the Related Art

For example, an electronic wristwatch is configured such that the stem is pulled outward to a predetermined position and rotated so that the hands thereof move corresponding to the rotation of the stem for time adjustment. As a time adjusting device for an electronic wristwatch such as this, a device configured as described in United States Patent Application No. 2008/0112275 is known in which the wristwatch case is provided with a stem that is movable to a first position and a second position in the axial direction thereof and rotatable in the direction of rotation around the axis of the stem, and magnetic sensors positioned in the circumferential direction of magnets provided in the stem are provided inside the wristwatch case.

This stem is, after a timepiece module is attached to the wristwatch case, inserted into a through-hole in the wristwatch case from the outer side of the wristwatch case. Therefore, in the case of a structure where the magnets are fixed to the stem, large magnets cannot be attached, and as a result, the rotation of the stem cannot be detected with high accuracy.

Also, in Japanese Utility Model Application Laid-Open (Kokai) Publication No. 60-78547, a rotary switch that operates by magnetic force is described. In this known rotary switch, a permanent magnet is attached to a rotor plate rotatably held inside the timepiece case, and a projecting section is provided on the inner tip of the crown. When the knob of the crown is pulled out to the outside of the timepiece case, the projecting section on the inner tip of the crown faces a contact section of the permanent magnet. Then, when the knob is rotated in this state, the projecting section of the crown comes into contact with the contact section of the permanent magnet, and the permanent magnet rotates with the rotation of the crown.

In this switch device, when the knob is pulled out, there is a possibility that the projecting section and the contact section collide depending on the positional relationship between the projecting section and the contact section. Therefore, there is a problem that the projecting section or the permanent magnet is deformed or damaged thereby.

SUMMARY OF THE INVENTION

The present invention has been conceived to solve the above-described problems. The object of the present invention is to provide a rotary switch and an electronic timepiece that detect the rotation of an operating member with high accuracy by allowing the use of a large magnet member, and prevents damage to the operating member and the magnet member even when the operating member is moved in the axial direction.

In order to achieve the above-described object, in accordance with one aspect of the present invention, there is provided a rotary switch comprising: an operating member that is operable to move from outside of a case to a first position and a second position in an axial direction, and operable in a rotation direction; a magnet member that is rotated by rotation of the operating member; and a magnetic sensor that detects rotation of the magnet member; wherein an engaging section having a non-circular cross-sectional shape is formed in a predetermined area of the operating member, an engaging hole into which the engaging section of the operating member is inserted is formed in the magnet member, the magnet member is provided in such a manner not to move in the axial direction of the operating member, when the operating member is moved in the axial direction, the engaging section of the operating member moves inside the engaging hole of the magnet member with the engaging section of the operating member being engaged with the engaging hole of the magnet member, and when the operating member is rotated, the magnet member rotates with the operating member.

In accordance with another aspect of the present invention, there is provided an electronic timepiece comprising: an operating member provided in a through-hole of a timepiece case in such a manner to be operable to move to a first position and a second position in an axial direction, and operable in a rotation direction; a magnet member that is disposed inside the timepiece case and rotated by rotation of the operating member; and a magnetic sensor that detects rotation of the magnet member; wherein an engaging section having a non-circular cross-sectional shape is formed in a predetermined area of the operating member, an engaging hole into which the engaging section of the operating member is inserted is formed in the magnet member, the magnet member is provided in such a manner not to move in the axial direction of the operating member, when the operating member is moved in the axial direction, the engaging section of the operating member moves inside the engaging hole of the magnet member with the engaging section of the operating member being engaged with the engaging hole of the magnet member, and when the operating member is rotated, the magnet member rotates with the operating member.

The above and further objects and novel features of the present invention will more fully appear from the following detailed description when the same is read in conjunction with the accompanying drawings. It is to be expressly understood, however, that the drawings are for the purpose of illustration only and are not intended as a definition of the limits of the invention.

BRIEF DESCRIPTION OF THE DRAWINGS

FIG. 11A is an enlarged cross-sectional view of the main section taken along E-E in FIG. 10, and FIG. 11B is a diagram showing connecting sections of the printed circuit board;

FIG. 12A is an enlarged rear view of the main section showing the magnet member in FIG. 8 where the setting lever and the magnet pressing section have been removed, and FIG. 12B is an enlarged cross-sectional view of the main section taken along F-F in FIG. 12A.

DETAILED DESCRIPTION OF THE PREFERRED EMBODIMENTS

The present invention will hereinafter be described in detail with reference to the preferred embodiments shown in the accompanying drawings.

An embodiment will hereinafter be described where the present invention has been applied to a pointer type electronic wristwatch.

In FIG. 3, FIG. 5, FIG. 6, FIG. 7, and FIG. 11A, the upper portion of the diagram shows the case back side of the wristwatch while the lower portion of the diagram shows the watch glass side of the wristwatch. FIG. 1, FIG. 2, FIG. 4, FIG. 8, FIG. 9, FIG. 10, and FIG. 12A are planar views seen from the case back side of the wristwatch.

Figure 1:
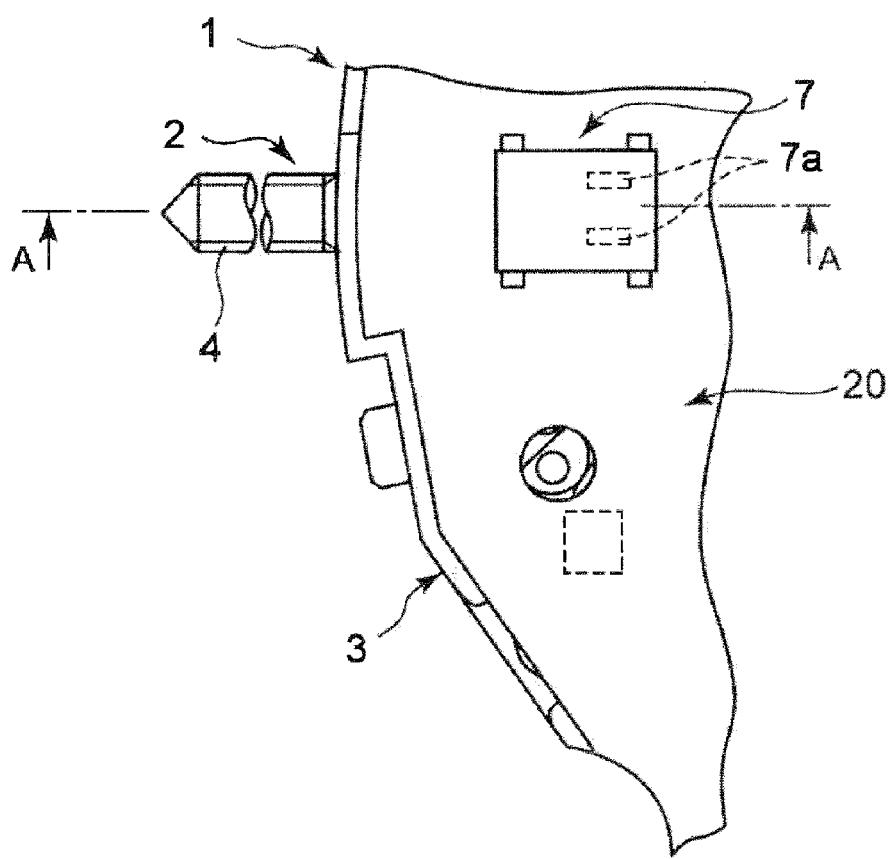
FIG. 1 is an enlarged rear view of the main section of a timepiece module according to an embodiment where the present invention has been applied to an electronic wristwatch.
Figure 2:
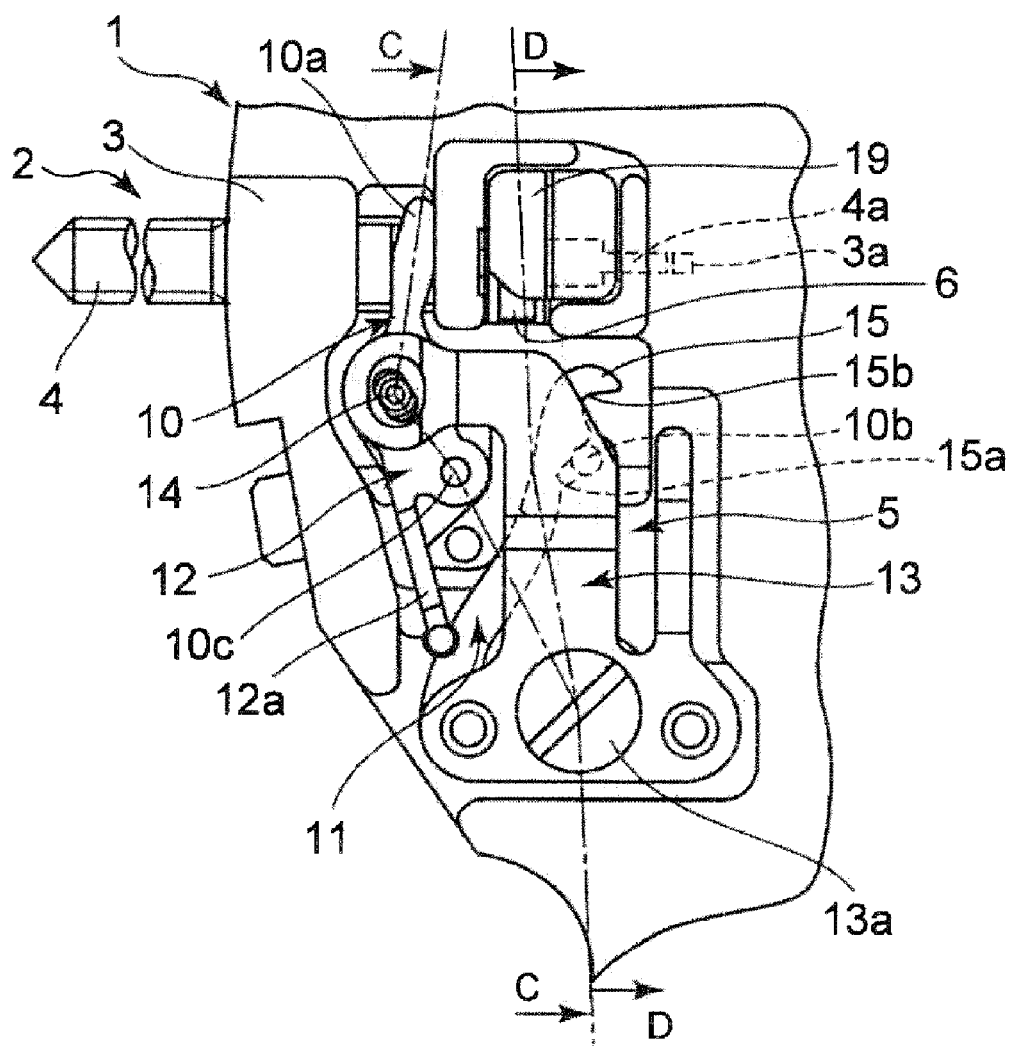
FIG. 2 is an enlarged rear view of the main section of the timepiece module in FIG. 1 where the printed circuit board has been removed.

As shown in FIG. 1 and FIG. 2, the electronic wristwatch includes a timepiece module 1, and the timepiece module 1 is incorporate into a wristwatch case. A timepiece movement that moves the hands and a time adjusting device 2 that is used to adjust time are included in this timepiece module 1.

As shown in FIG. 1 to FIG. 5, the time adjusting device 2 includes a stem 4, a position regulating member 5, a magnet member 6, and a magnetic sensor 7. The stem 4, which is provided on a main plate 3, is operable to move in the axial direction and operable in the direction of rotation around the axis. The position regulating member 5 regulates the movement zone of the stem 4 in the axial direction. The magnet member 6 is slidably provided on the stem 4 and rotates with the stem 4. The magnetic sensor 7 is positioned in the circumferential direction of the magnet member 6 and detects the rotation of the magnet member 6.

Figure 3:
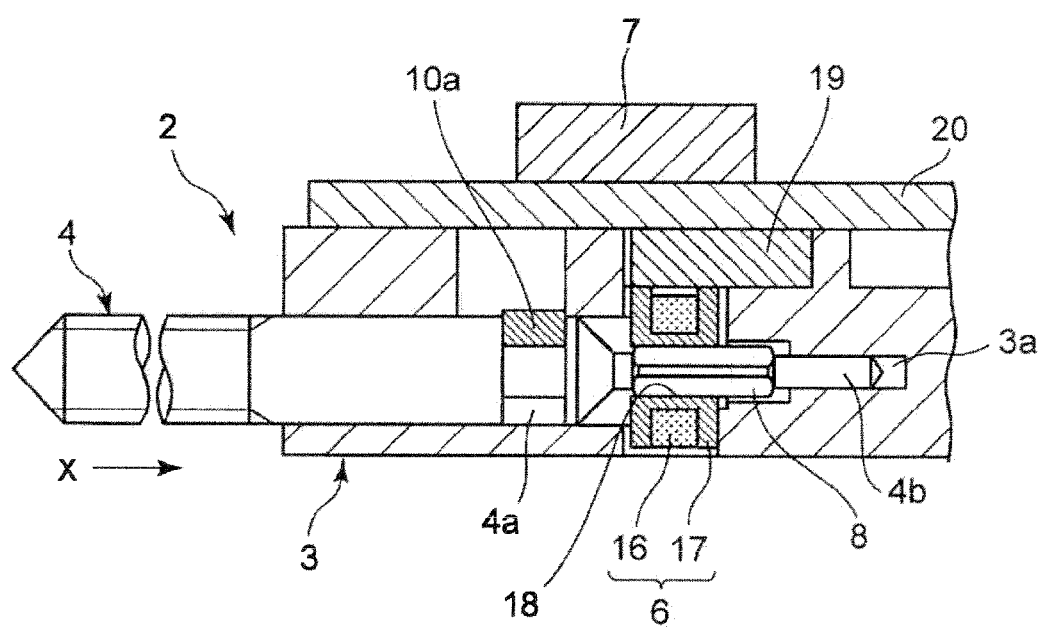
FIG. 3 is an enlarged cross-sectional view taken along A-A in FIG. 1.
Figure 4:
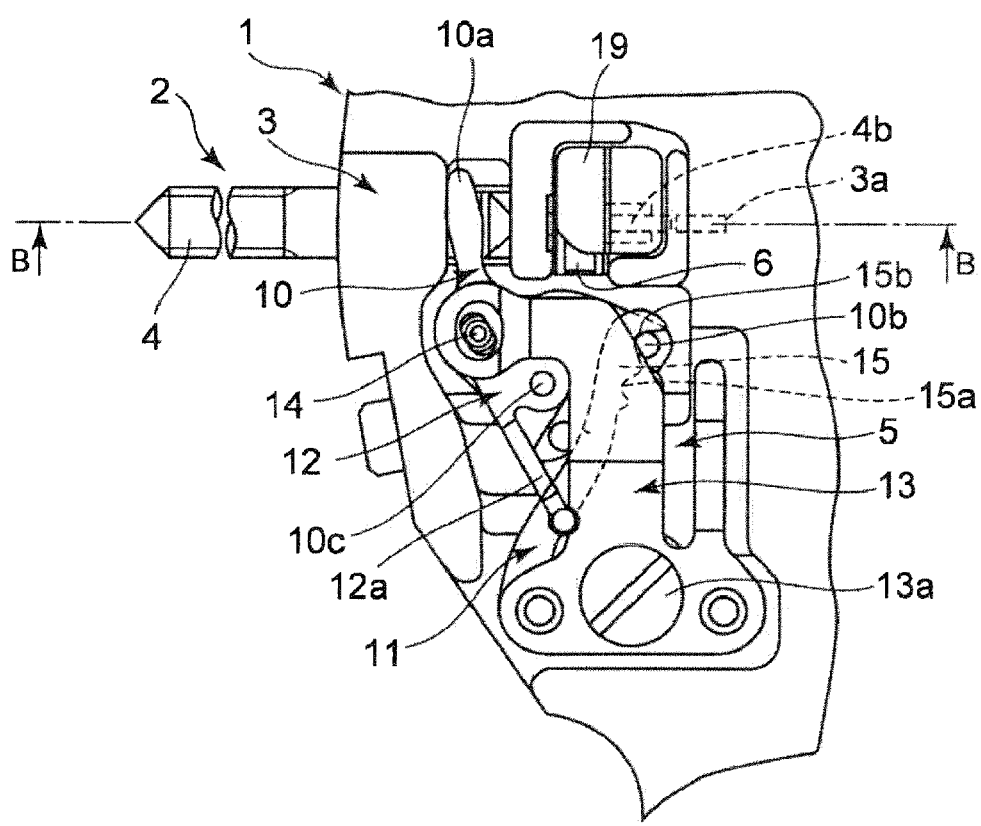
FIG. 4 is an enlarged rear view of the main section in the state shown in FIG. 2 where the stem has been pulled outward to a second position.
Figure 5:
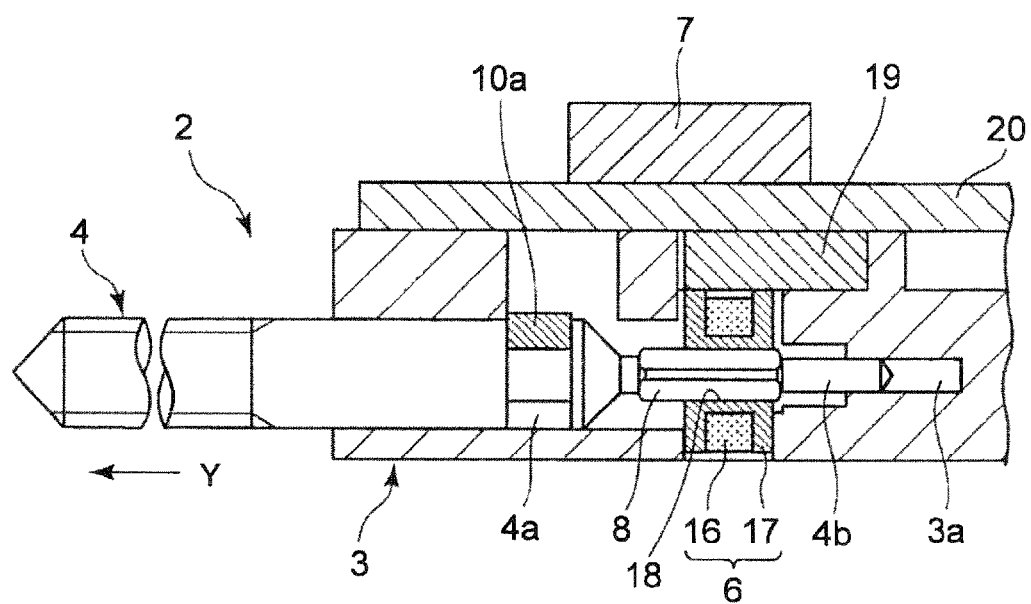
FIG. 5 is an enlarged cross-sectional view taken along B-B in FIG. 4.

As shown in FIG. 3 and FIG. 5, the stem 4 is formed into a roughly cylindrical bar. One end of the stem 4 (left-end portion in FIG. 3) protrudes from the main plate 3 in the lateral direction, and this protruding outer end protrudes outside of a wristwatch case (not shown). A crown is fixed onto the tip of the protruding outer end. The stem 4 is attached to the timepiece module 1 by being inserted from the outer side of the wristwatch case into a through-hole formed in the wristwatch case, in a state where the timepiece module 1 has been mounted on the wristwatch case. As described above, this stem 4, which is provided on a main plate 3, is movable in the axial direction and operable in the direction of rotation around the axis. As shown in FIG. 3 and FIG. 5, a small-diameter stepped recess section 4a is formed in a ring shape in a roughly intermediate portion of the stem 4. An engaging section 8 having a rectangular cross-sectional shape is provided on a tip end side (right-end side in FIG. 4) of the stepped recess section 4a positioned towards the inner side of the timepiece module 1.

As shown in FIG. 3 and FIG. 5, a small-diameter shaft section 4b is provided on a tip end side (right-end side in FIG. 3) of the engaging section 8 positioned towards the inner side of the stem 4. This shaft section 4b, which is inserted into a guide hole 3a provided in the main plate 3, is movable in the axial direction and rotatable around the axis. As a result, the stem 4 is configured to move between a first position where the stem 4 has been pressed inward in the axial direction (arrow X direction) as shown in FIG. 3, and a second position where the stem 4 has been pulled outward in the axial direction (arrow Y direction) as shown in FIG. 5.

Figure 6:
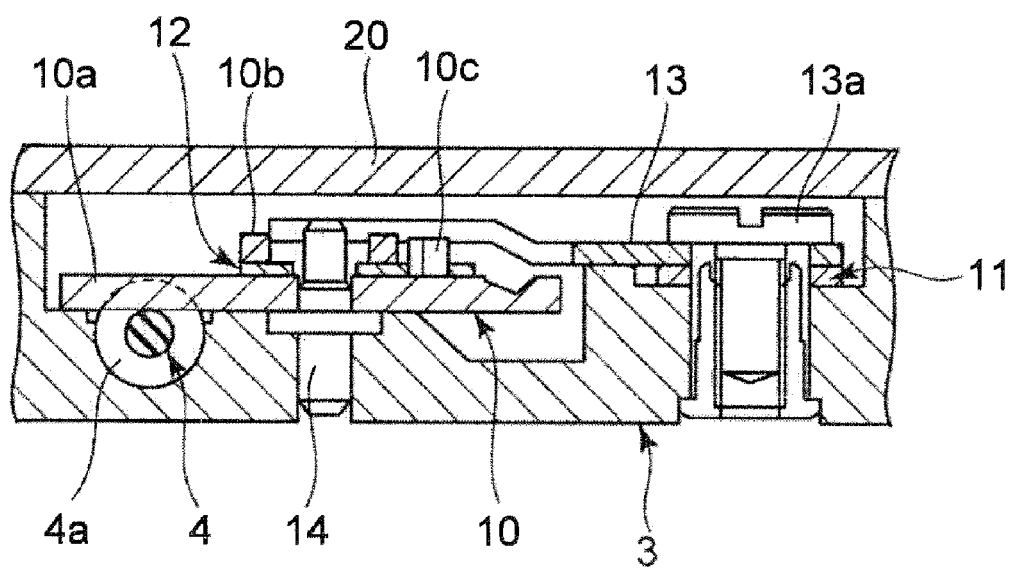
FIG. 6 is an enlarged cross-sectional view taken along C-C in FIG. 2.
Figure 7:
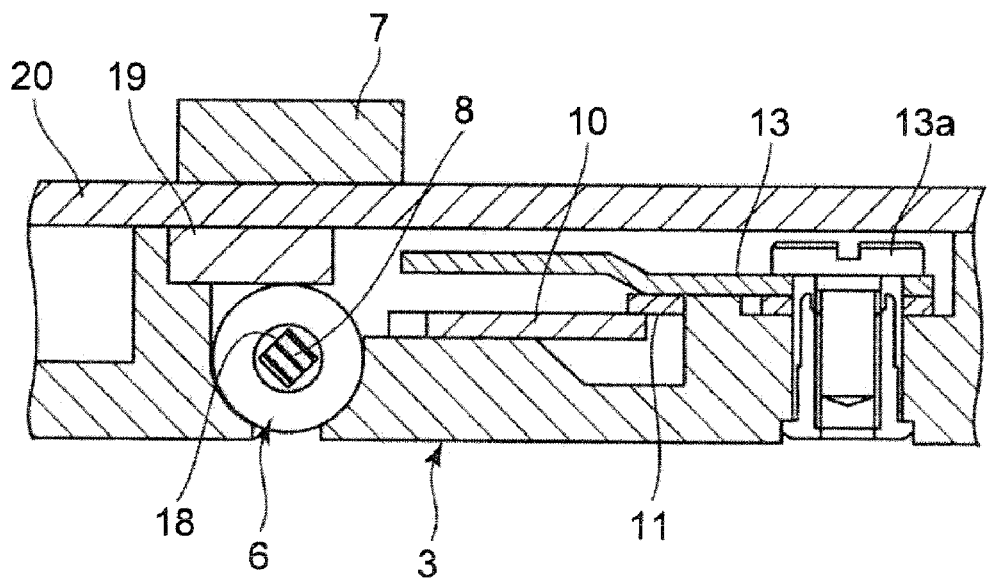
FIG. 7 is an enlarged cross-sectional view taken along D-D in FIG. 2.
Figure 8:
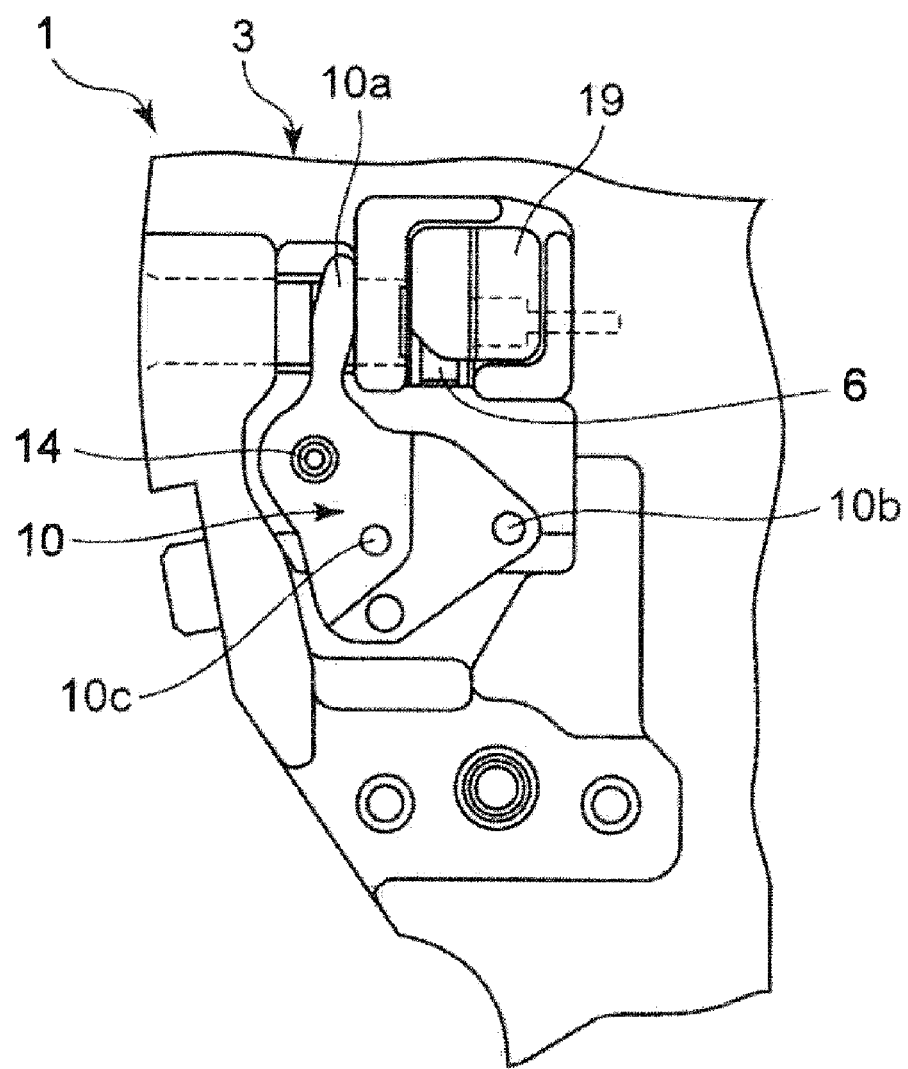
FIG. 8 is an enlarged rear view of the main section in FIG. 2 where a setting lever has been placed on the main plate.

As shown in FIG. 2 to FIG. 10, the position regulating member 5 includes a setting lever 10, a setting lever spring 11, a switch plate 12, and a pressing plate 13. As shown in FIG. 8, the setting lever 10, which is formed into a flat plate, is rotatably attached to a supporting shaft 14 provided on the main plate 3, and rotates with the movement of the stem 4 in the axial direction.

In other words, the setting lever 10 includes an interlocking arm section 10a, an interlocking pin 10b, and an interlocking pin 10c. The interlocking arm section 10a is disposed in the stepped recess section 4a of the stem 4. Also, the position of the interlocking pin 10b is elastically regulated by the setting lever spring 11. The interlocking pin 10c rotates the switch plate 12 with the setting lever 10. Therefore, as shown in FIG. 2 and FIG. 4, the setting lever 10 is configured to rotate around the supporting shaft 14 as a result of the interlocking arm section 10a swinging with the stepped recess section 4a of the stem 4, when the stem 4 moves in the axial direction.

Figure 9:
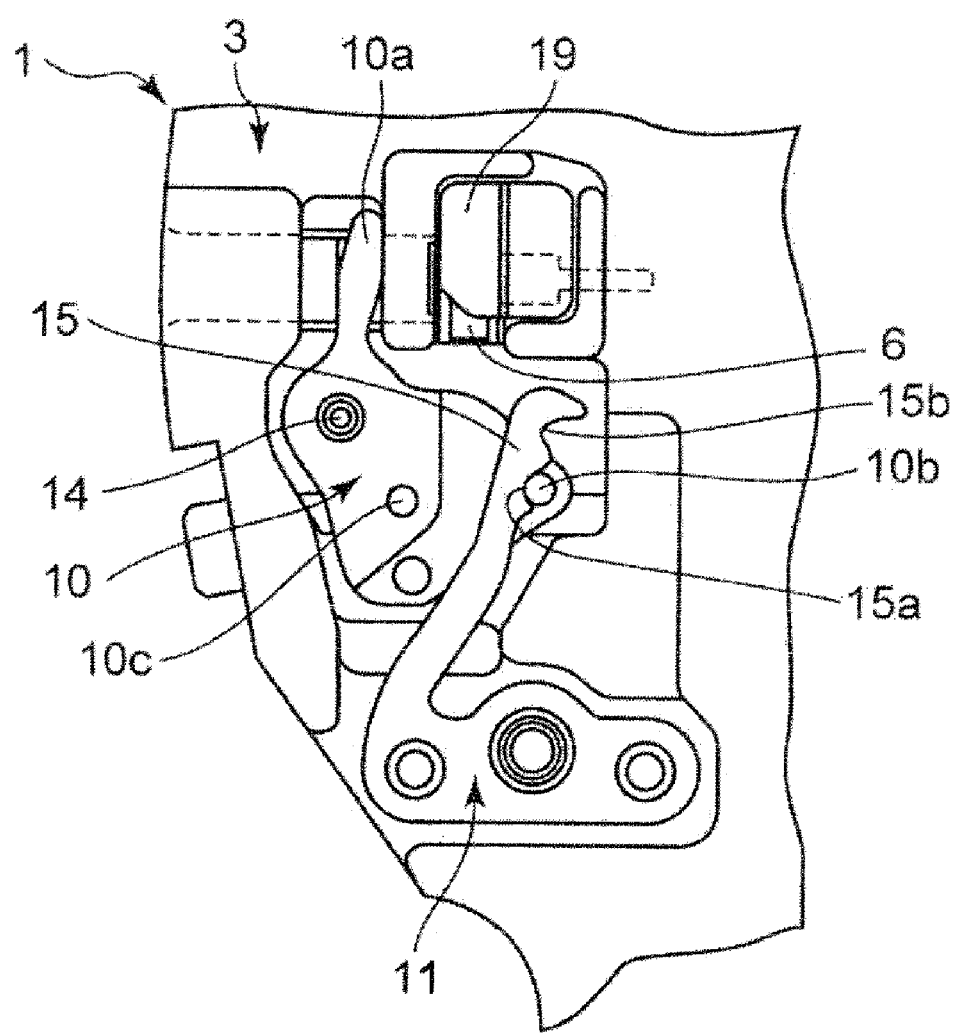
FIG. 9 is an enlarged rear view of the main section in FIG. 8 where a setting lever spring has been further placed.

As shown in FIG. 6 and FIG. 9, the setting lever spring 11, which is a flat spring fixed to the main plate 3 in an area near the setting lever 10, is configured to regulate the rotational position of the setting lever 10 and the movement position of the stem 4 in the axial direction by elastically holding the interlocking pin 10b of the setting lever 10 and regulating the position of the interlocking pin 10b. In other words, as shown in FIG. 9, a position regulating section 15 that elastically holds the interlocking pin 10b of the setting lever 10 is provided on a tip end section of the setting lever spring 11. As shown in FIG. 9, the position regulating section 15 is provided with a plurality of locking recess sections 15a and 15b that elastically lock the interlocking pin 10b.

As a result, when the stem 4 is pressed inward to the first position as shown in FIG. 3, the setting lever spring 11 regulates the stem 4 to the first position by one locking recess section 15a of the position regulating section 15 elastically locking the interlocking pin 10b of the setting lever 10 as shown in FIG. 2 and FIG. 9.

When the stem 4 is pulled outward in the axial direction to the second position as shown in FIG. 5, the setting lever spring 11 regulates the stem 4 to the second position by the setting lever 10 rotating around the supporting shaft 14, the interlocking pin 10b rotating with the rotation of the setting lever 10, and the other locking recess section 15b of the position regulating section 15 elastically locking the interlocking pin 10b.

Figure 10:
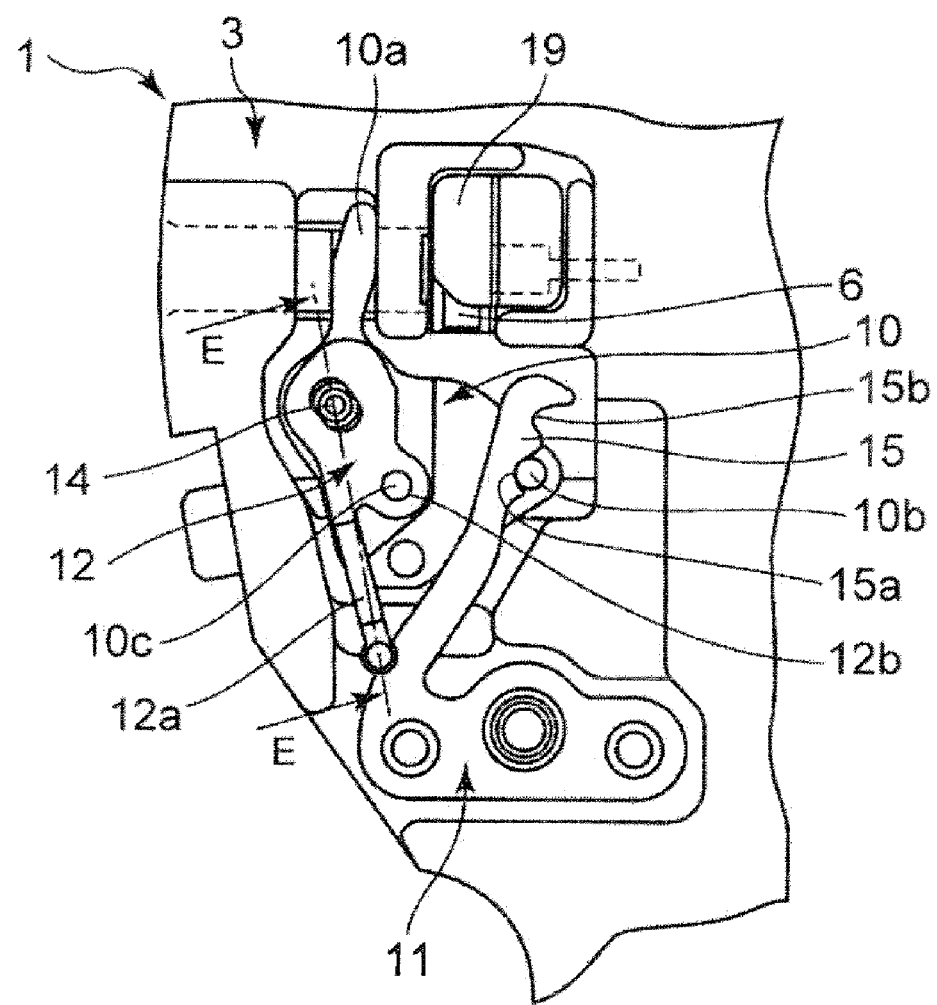
FIG. 10 is an enlarged rear view of the main section in FIG. 9 where a switch plate has been further placed.
Figure 11A:
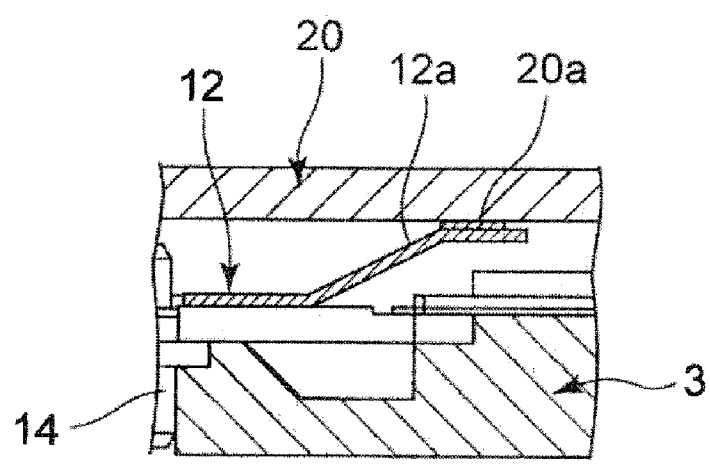
FIG. 11A and FIG. 11B are diagrams showing the switch plate in FIG. 10 and the printed circuit board in the area corresponding thereto, and of these diagrams.

As shown in FIG. 10 and FIG. 11, the switch plate 12 is made of a metal plate and is rotatably attached to the supporting shaft 14 of the main plate 3 with the setting lever 10. As shown in FIG. 11A, the switch plate 12 is provided with a contact spring section 12a that is in contact with the bottom surface of a printed circuit board 20 described hereafter and slides. The contact spring section 12a is provided extending in a direction opposite to the interlocking arm section 10a of the setting lever 10 as shown in FIG. 10. As shown in FIG. 10, an insertion hole 12b into which the interlocking pin 10c of the setting lever 10 is inserted is provided in a predetermined area of the switch plate 12.

As a result, as shown in FIG. 10 and FIG. 11, the switch plate 12 is configured to rotate around the supporting shaft 14 with the setting lever 10, in a state where the tip end section of the contact spring section 12a is in contact with the bottom surface of the printed circuit board 20. The tip end section of the contact spring section 12a switches the contact position between contact point sections 20a and 20b provided on the bottom surface of the printed circuit board 20. As shown in FIG. 2, FIG. 6, and FIG. 7, the pressing plate 13, which is attached to the main plate 3 with the setting lever spring 11 by a screw 13a, presses the setting lever 10 against the main plate 3 by pressing against the setting lever spring 11 and the switch plate 12.

Figure 12A:
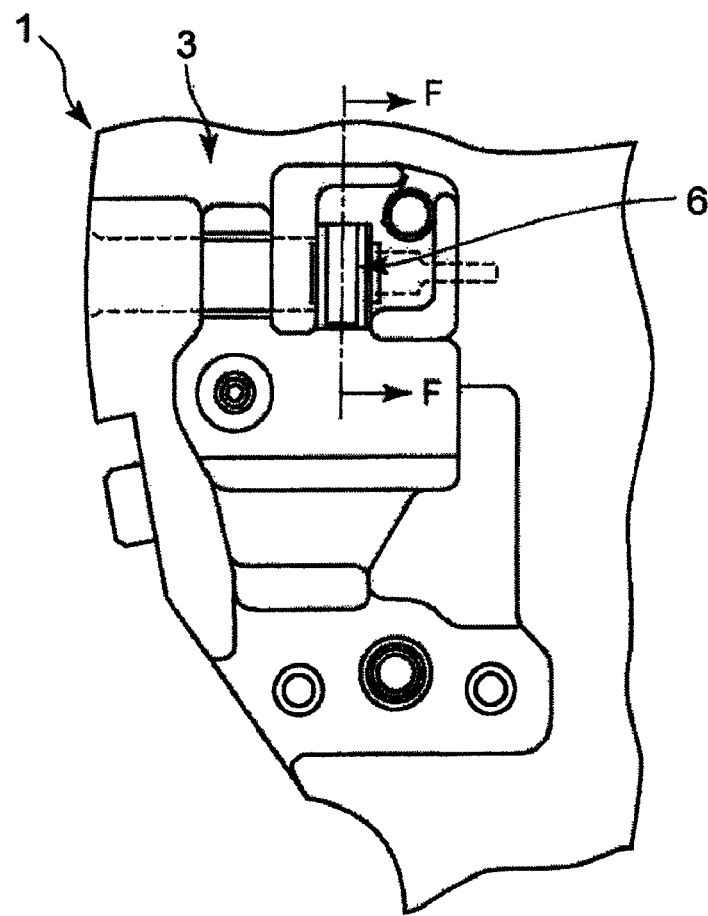
FIG. 12A and FIG. 12B are diagrams showing the magnet member in FIG. 3, and of these diagrams.
Figure 12B:
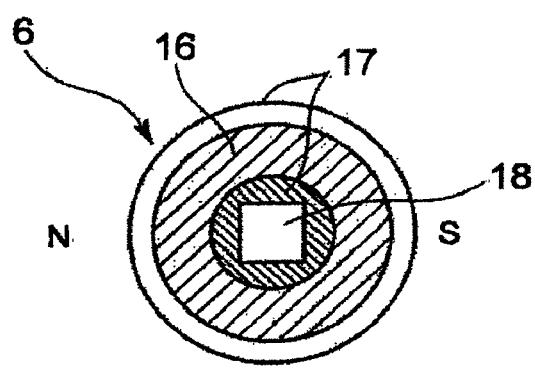

As shown in FIG. 12A and FIG. 12B, the magnet member 6 slidably provided on the stem 4 is constituted by a ring-shaped magnet 16 and a resin section 17 that covers the magnet 16, and the overall magnet member 6 is shaped into a roughly circular plate. An engaging hole 18 having a rectangular cross-sectional shape is provided in the center portion of this magnet member 6, and the engaging section 8 of the stem 4 is inserted into this engaging hole 18. In this state, as shown in FIG. 3 and FIG. 5, a portion of the outer circumferential surface of the magnet member 6 is pressed by a magnet pressing section 19 provided on the main plate 3.

Therefore, as shown in FIG. 3 and FIG. 5, the magnet member 6 is pressed by the magnet pressing section 19 even when the engaging section 8 of the stem 4 is slidably inserted into the engaging hole 18 and the stem 4 moves in the axial direction in this state. As a result, the magnet member 6 moves relative to the stem 4 and is always held at a fixed position. The magnet member 6 rotates with the stem 4 in this state.

In other words, when the stem 4 is pressed inward into the first position as shown in FIG. 2, the magnet member 6 is positioned on the end section side (left side in FIG. 3) of the outer side of the engaging section 8 positioned on the inner side of the stem 4 as shown in FIG. 3. When the stem 4 is pulled outward to the second position as shown in FIG. 4, the magnet member 6 is positioned on the tip end side (right side in FIG. 5) of the inner side of the engaging section 8 positioned on the inner side of the stem 4 as shown in FIG. 5.

As shown in FIG. 1, FIG. 3, and FIG. 5, the magnetic sensor 7 is provided in an area of the printed circuit board 20 provided on the back surface (upper surface in FIG. 3) of the main plate 3 corresponding to the magnet member 6. This magnetic sensor includes two magnetic detecting elements such as two magnetoresistance elements (MR elements) 7a, and after detecting a change in the magnetic field accompanying the rotation of the magnet member 6, outputs two types of detection signals: high (H) and low (L).

In other words, because the two magnetoresistance elements 7a in the magnetic sensor 7 are set in different positions, when a change in the magnetic field accompanying the rotation of the magnet member 6 is detected, a phase difference occurs in the output. The rotation of the magnet member 6 can be detected by two types of detection signals being outputted because of this phase difference. In this instance, the rotation of the magnet member 6 is calculated by the two types of detection signals being analyzed by a microcomputer provided on the printed circuit board 20.

The magnetic sensor 7 also detects the rotation direction of the magnet member 6 (whether the magnet member 6 is rotating in a normal direction or a reverse direction), as well as whether or not the normal rotation or the reverse rotation of the magnet member 6 is continuous. As a result, based on a rotation direction detection signal detected by the magnetic sensor 7, the hands are rotated in a normal direction (clockwise direction) or a reverse direction (counter-clockwise direction). In addition, based on a detection signal detected by the magnetic sensor 7 regarding whether or not the rotation of the magnet member 6 is continuous, when the rotation is continuous, the hands are rotated in the normal direction (clockwise direction) or the reverse direction (counter-clockwise direction) at a high speed.

Various electronic components (not shown) required by a timepiece function, such as an integrated circuit device (IC and large scale integration (LSI)), are provided on the top surface of the printed circuit board 20. Also, wiring patterns (not shown) made of metal such as copper foil are formed on the top and bottom surfaces of the printed circuit board 20. In this instance, the wiring patterns (not shown) are not formed on the printed circuit board 20 in the area between the magnetic sensor 7 and the magnet member 6.

Figure 13:
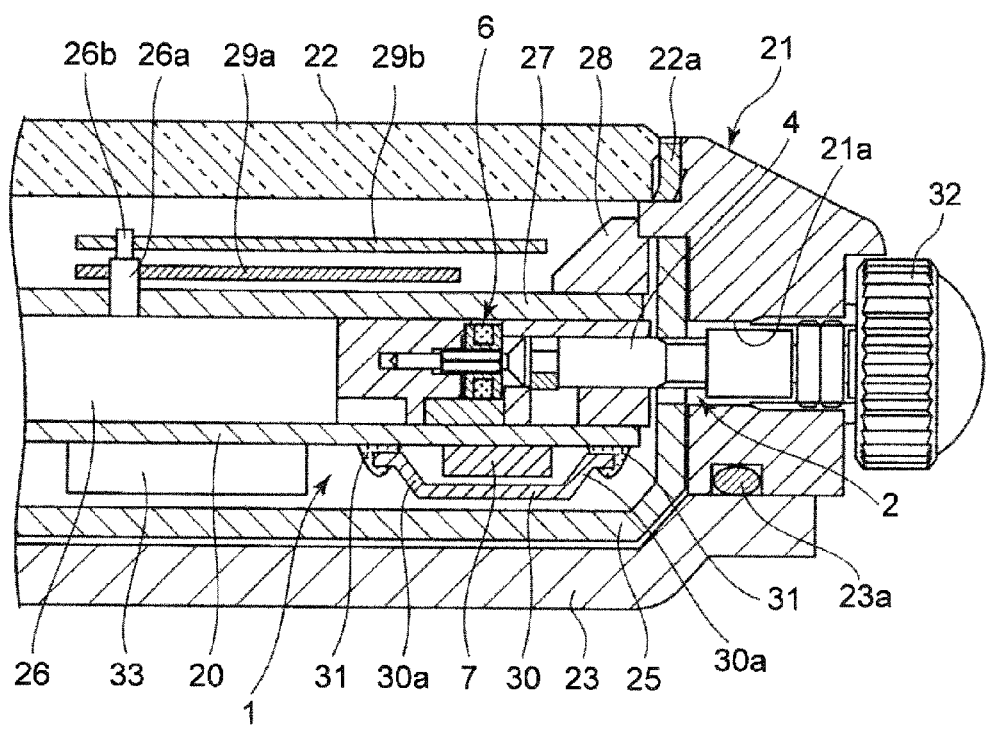
FIG. 13 is a cross-sectional view of the timepiece module in FIG. 1 incorporated into a wristwatch case.

FIG. 13 is a cross-sectional view of the timepiece module 1 incorporated into a wristwatch case 21. A watch crystal 22 is attached to the upper opening section of the wristwatch case 22 by a gasket 22a, and a case back 23 is attached to the bottom section of the wristwatch case 21 by a water-proof ring 23a.

A crown 32 is attached to one end of the stem 4 (right-end portion in FIG. 13), and the stem 4 is inserted from the outer side into a through-hole 21a provided on the side wall section of the wristwatch case 21.

A casing ring 25 for attaching the timepiece module 1 to the wristwatch case 21 is provided inside the wristwatch case 21. This timepiece module 1 includes a timepiece movement 26 that moves the hands. A dial 27 is provided on the top surface of the timepiece module 1, and a ring-shaped panel member 28 is provided on the top surface of this dial 27. An hour hand shaft 26a and a minute hand shaft 26b protrude from the top surface of the timepiece movement 26, and an hour hand 29a and a minute hand 29b are attached to the hour hand shaft 26a and the minute hand shaft 26b, respectively.

A magnetic shield plate 30 is disposed on the magnetic sensor 7 in such a manner to cover the magnetic sensor 7. This magnetic shield plate 30 is made of a magnetic material such as low-carbon steel (SPCC) and is roughly plate-shaped. An attaching section 30a bent upwards at an angle is formed on both side sections of the magnetic shield plate 30, and each bent attaching section 30a is attached to the pattern formed on the bottom surface of the printed circuit board 20 by a solder 31.

An LSI 33 including a microcomputer is mounted on the printed circuit board 20.

Next, operations of the electronic wristwatch will be described.

First, when the stem 4 is pressed inward in the axial direction and moved to the first position, as shown in FIGS. 2 and 3, the stepped recess section 4a of the stem 4 moves to the inner side of the timepiece module 1 (right side in FIG. 3), and the engaging section 8 of the stem 4 is pressed in the arrow X direction shown in FIG. 3. In this state, because the magnet member 6 is being pressed by the magnet pressing section 19, the magnet member 6 does not move with the stem 4 even when the stem 4 is pressed inward. The magnet member 6 is positioned on the end section side (left side in FIG. 3) on the outer side of the engaging section 8 of the stem 4 and corresponds to the magnet sensor 7.

At this time, because the stepped recess section 4a of the stem 4 moves towards the inner side of the timepiece module 1, as shown in FIG. 8, the interlocking arm section 10a of the setting lever 10 moves towards the inner side (right side in FIG. 8) of the timepiece module 1, and the setting lever 10 rotates around the supporting shaft 14 in the clockwise direction. With the rotation of the setting lever 10, as shown in FIG. 2 and FIG. 9, the interlocking pin 10b is elastically held by one locking recess section 15a of the position regulating section 15 provided on the setting lever spring 11. As a result, the stem 4 is regulated to the first position to which the stem 4 has been pressed inward.

In addition, at this time, because the switch plate 12 is connected to the setting lever 10 by the interlocking pin 10c of the setting lever 10, as shown in FIG. 10, the switch plate 12 rotates with the setting lever 10 around the supporting shaft 14 in the clockwise direction. As a result, the switch plate 12 rotates with the tip end section of the contact spring section 12a of the switch plate 12 being in contact with the bottom surface of the printed circuit board 20, as shown in FIG. 11A.

Figure 11B:
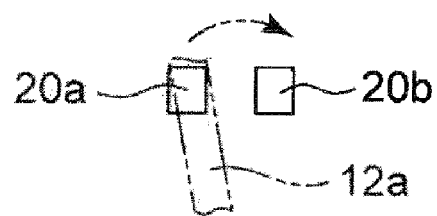

As a result, as shown in FIG. 11B, the contact spring section 12 moves to one contact point section 20a (left side in FIG. 11B) of the printed circuit board 20 and comes into contact with the contact point section 20a, thereby turning OFF the magnetic sensor 7. In the OFF state, magnetic detection by the magnetic sensor 7 is stopped. Therefore, even when the stem 4 is rotated and the magnet member 6 rotates, the magnetic sensor 7 does not detect the rotation of the magnet member 6.

On the other hand, when the stem 4 is pulled outward in the axial direction to the second position, as shown in FIG. 4 and FIG. 5, the stepped recess section 4a of the stem 4 moves towards the outer side of the timepiece module 1, and the engaging section 8 of the stem 4 moves in the direction in which the stem 4 is pulled (left direction indicated by arrow Y in FIG. 5). At this time as well, the magnet member 6 is being pressed by the magnet pressing section 19. Therefore, even when the stem 4 moves in the direction in which the stem 4 is pulled, the magnet member 6 does not move with the stem 4. The magnet member 6 is positioned on the tip end section side (right side in FIG. 5) on the inner side of the engaging section 8 of the stem 4.

At this time, as shown in FIG. 4, because the stepped recess section 4a of the stem 4 moves towards the outer side of the timepiece module 1, the interlocking arm section 10a of the setting lever 10 moves towards the outer side of the timepiece module 1, and the setting lever 10 rotates around the supporting shaft 14 in a counter-clockwise direction. With the rotation of the setting lever 10, as shown in FIG. 4, the interlocking pin 10b is elastically held by the other locking recess section 15b of the position regulating section 15 provided on the setting lever spring 11. As a result, the stem 4 is regulated to the second position in which the stem 4 is pulled outward.

At this time as well, because the switch plate 12 is connected to the setting lever 10 by the interlocking pin 10c of the setting lever 10, as shown in FIG. 4, the switch plate 12 rotates with the setting lever 10 around the supporting shaft 14 in the counter-clockwise direction. As a result, the switch plate 12 rotates in a direction opposite to that described above with the tip end section of the contact spring 12a of the switch plate 12 being in contact with the printed circuit board 20, as shown in FIG. 11A. As a result, as shown in FIG. 11B, the tip end section moves to the other contact point section 20b (right side in FIG. 11B) of the printed circuit board 20 and comes into contact with the contact point section 20b, thereby turning ON the magnetic sensor 7 to enable magnetic detection by the magnetic sensor 7.

When the stem 4 is rotated in this state, the magnet member 6 rotates with the stem 4, causing a change in the magnetic field which is detected by the magnetic sensor 7. As a result, the magnetic sensor 7 detects the rotation of the magnetic member and outputs a detection signal. This detection signal outputted from the magnetic sensor 7 is analyzed by the microcomputer on the printed circuit board 20, and the hands (not shown) are moved depending on the rotation of the stem 4 for time adjustment. At this time, the magnetic sensor 7 detects the rotation direction of the magnet member 6 (whether the magnet member 6 is rotating in the normal direction or the reverse direction), and the hands are moved in the normal direction (clockwise direction) or the reverse direction (counter-clockwise direction) for time adjustment.

At this time, when the magnetic sensor 7 detects that the normal rotation or the reverse rotation of the magnet member 6 is continuous, the hands are moved in the normal direction (clockwise direction) or the reverse direction (counter-clockwise direction) at a high speed. As a result, the time is quickly adjusted. When the stem 4 is not rotated for a period of several tens of seconds in the second position to which the stem 4 has been pulled outward, the magnetic sensor 7 enters an OFF state, and power consumption is prevented.

As just described, in this electronic wristwatch, because the engaging section 8 having a non-circular cross-section of the stem 4 engages with the engaging hole 18 of the magnet member 6, the magnet member 6 can be moved relative to the stem 4 when the stem 4 is moved in the axial direction. As a result, the magnet member 6 can be constantly held in a fixed position with respect to the axial direction of the stem 4.

Therefore, even when the stem 4 is moved in the axial direction, the magnet member 6 can constantly correspond to the magnetic sensor 7 without damage to the stem 4 or the magnet member 6. Therefore, even when the stem 4 is moved to a plurality of positions in the axial direction, the rotation of the stem 4 can be accurately detected by a single magnetic sensor 7. In addition, because the magnetic sensor 7 is not in contact with the magnet member 6, a highly durable electronic wristwatch can be provided.

In this instance, the magnetic sensor 7 can detect the rotation of the magnet member 6 and output a detection signal. In addition, this outputted detection signal can be analyzed by the microcomputer on the printed circuit board 20, and the hands (not shown) can be moved depending on the rotation of the stem 4 for time adjustment. At this time, because the magnetic sensor 7 detects the rotation direction (normal rotation or reverse rotation) of the magnet member 6, the hands may be rotated in the normal direction (clockwise direction) or the reverse direction (counter-clockwise direction). In addition, at this time, because the magnetic sensor 7 detects whether or not the normal rotation or the reverse rotation of the magnet member 6 is continuous, when the rotation is continuous, the hands can be rotated in the normal direction (clockwise direction) or the reverse direction (counter-clockwise direction) at a high speed, allowing the time to be quickly adjusted.

Also, this electronic wristwatch includes the position regulating member 5 that regulates the position of the stem 4 in the axial direction to the first position and the second position. Therefore, the stem 4 can be accurately and unfailingly regulated to the first position and the second position in the axial direction of the stem 4. In other words, because the position regulating member 5 includes the setting lever 10 that rotates with the movement of the stem 4 in the axial direction, and the setting lever spring 11 that elastically holds the interlocking pin of the setting lever 10 by the locking recess sections 15a and 15b of the position regulating section 15, the position regulating section 15 of the setting lever spring 11 can regulate the rotation position of the setting lever 10, thereby unfailingly regulating the position of the stem 4 in the axial direction.

Moreover, the stem plate 12 is included which is a contact point switching member that switches between the contact point sections 20a and 20b of the printed circuit board 20 depending on whether the stem 4 is pushed inward in the axial direction to the first position or pulled outward in the axial direction to the second position. Therefore, even when the magnet member 6 is constantly corresponding to the magnetic sensor 7, the magnetic sensor 7 can be switched ON and OFF by the switch plate 12 being switched between the contact point sections 20a and 20b of the printed circuit board 20.

In other words, the switch plate 12 can rotate with the setting lever 10 which rotates with the movement of the stem 4 in the axial direction, and the contact spring section 12a may switch between the contact point sections 20a and 20b of the printed circuit board 20. Therefore, when the stem 4 is pushed inward to the first position, the contact spring section 12a comes into contact with one contact point section 20a, and the magnetic sensor 7 is turned OFF. In addition, when the stem 4 is pulled out to the second position, the contact spring section 12a comes into contact with the other contact point section 20b, and the magnetic sensor 7 is turned ON.

Therefore, when the stem 4 is pushed inward to the first position, idle current can be prevented from flowing into the magnetic sensor 7 because the magnetic sensor 7 is turned OFF. Even when the stem 4 is rotated and the magnet member 6 is rotated in this state, the magnetic sensor 7 does not detect the rotation of the magnet member 6, and therefore, power consumption by the magnetic sensor 7 can be reduced.

Also, when the stem 4 is pulled outward to the second position, when the stem 4 is rotated and the magnet member 6 is rotated, the magnetic sensor 7 may detect the rotation of the magnet member 6 because the magnetic sensor 7 is turned ON. In this instance, when the stem 4 is pulled out to the second position, if the stem 4 is not rotated for a period of several tens of seconds, the magnetic sensor 7 is turned OFF. Therefore, power consumption by the magnetic sensor 7 can be suppressed and thereby achieving reduction in power consumption.

Moreover, in this electronic wristwatch, the magnetic sensor 7 is provided on the printed circuit board 20 of the timepiece module 1 provided inside the wristwatch case, and disposed in such a manner to correspond to the magnet member 6 with the printed circuit board 20 being interposed therebetween. Therefore, the magnetic sensor 7 can be disposed side by side with various electronic components required by the timepiece function, such as integrated circuit devices (IC and LSI), mounted on the printed circuit board 20. As a result, high density mounting can be attained, and thereby achieving the thinning and miniaturization of the timepiece module 1.

In this instance, the wiring patterns formed by metal, such as copper foil, are provided on both top and bottom surfaces of the printed circuit board 20. However, the wiring patterns are not provided on the printed circuit board 20 in the area between the magnetic sensor 7 and the magnet member 6. Therefore, without being affected by the wiring patterns formed from metal such as copper foil, the magnetic sensor 7 can detect the rotation of the magnet member 6 with high sensitivity and high accuracy.

Note that, in the above-described embodiment, a case is described where the engaging section 8 having a rectangular cross-section is provided on the stem 4, and a rectangular engaging hole 18 into which the engaging section 8 of the stem 4 is inserted is provided in the center of the magnet member 6. However, the present invention is not limited thereto. The engaging section 8 of the stem 4 and the engaging hole 18 of the magnet member 6 can be polygonal such as triangular, pentagonal, or hexagonal, or non-circular such as elliptical or spline-shaped.

In addition, in the above-described embodiment, a case is described where the magnet member 6 is constituted by the magnet 16 and the resin section 17 that covers the magnet 16. However, the present invention is not limited thereto. For example, the magnet 16 may be protected by being covered by an exterior section made of a magnetic material. In a configuration such as this, a small magnet 16 can be used, thereby achieving the miniaturization of the overall magnet member 6.

Moreover, the magnet member 6 and the magnetic sensor 7 may be surrounded by a magnetic shield member. In a configuration such as this, the magnetic sensor 7 can be prevented from being affected by the magnetic field of a stepping motor assembled into the timepiece module. Therefore, the magnetic sensor 7 can detect the rotation of the magnet member 6 with higher accuracy.

Still further, in the above-described embodiment, a configuration is described in which the stem 4 moves between the first position and the second position in the axial direction. However, the configuration is not necessarily required to be that in which the stem 4 moves only between the first position and the second position. The stem 4 can be pulled further outward from the second position to a third position. In this configuration as well, the magnet member 6 does not move with the pulling operation of the stem 4 in the axial direction because the magnet member 6 is pressed by the magnet pressing section 19, and constantly corresponds to a single magnet sensor 7. Therefore, the rotation of the stem 4 can be detected by the single magnet sensor 7.

Lastly, in the above-described embodiment and in each variation example of the embodiment, a case is described where the present invention is applied to a pointer type electronic wristwatch. However, the present invention is not limited to the above-described embodiments. In other words, the present invention may be applied to various electronic timepieces such as a travel clock, an alarm clock, a mantelpiece clock, and a wall clock. In addition, the present invention may be widely applied to electronic devices such as a mobile phone and a personal digital assistant (PDA) besides electronic timepieces.

While the present invention has been described with reference to the preferred embodiments, it is intended that the invention be not limited by any of the details of the description therein but includes all the embodiments which fall within the scope of the appended claims.

What is claimed is:

1. A rotary switch comprising:
   an operating member that is operable from outside of a case to move to a first position and a second position in an axial direction and is rotatable, wherein an engaging section having a non-circular cross-sectional shape is formed in a predetermined area of the operating member;
   a magnet member comprising a ring-shaped magnet and a resin section that covers the ring-shaped magnet, wherein the magnet member as a whole has a substantially circular plate shape, wherein at an inside of the magnet member the resin section has an engaging hole formed therein which has a non-circular cross-sectional shape and into which the engaging section having the non-circular cross-sectional shape of the operating member is inserted, and wherein the magnet member is provided in such a manner that the magnet member does not move in the axial direction of the operating member; and a magnetic sensor that detects rotation of the magnet member, wherein when the operating member is moved in the axial direction, the engaging section of the operating member moves inside the engaging hole of the magnet member with the engaging section of the operating member being engaged with the engaging hole of the magnet member, and wherein when the operating member is rotated, the magnet member rotates with the operating member.

2. The rotary switch according to claim 1, wherein the magnetic sensor is provided on a printed circuit board provided inside the case, and corresponds to the magnet member with the printed circuit board being interposed therebetween.

3. The rotary switch according to claim 2, wherein a wiring pattern is not formed on the printed circuit board in an area between the magnet member and the magnetic sensor.

4. The rotary switch according to claim 1, wherein the magnetic sensor includes a pair of magnetic detecting elements and determines a rotation direction of the operating member based on an output from the pair of magnetic detecting elements.

5. The rotary switch according to claim 1, wherein the magnetic sensor is covered by a magnetic shield plate made of a magnetic material.

6. A rotary switch comprising:
an operating member that is operable from outside of a case to move to a first position and a second position in an axial direction and is rotatable, wherein an engaging section having a non-circular cross-sectional shape is formed in a predetermined area of the operating member;
a main plate to which the operating member is attached such that the operating member is movable in the axial direction and is rotatable;
a magnet member having an engaging hole formed therein into which the engaging section of the operating member is inserted, wherein the magnet member is provided on the main plate in such a manner that the magnet member does not move in the axial direction of the operating member; and
a magnetic sensor that detects rotation of the magnet member,
wherein when the operating member is moved in the axial direction, the engaging section of the operating member moves inside the engaging hole of the magnet member with the engaging section of the operating member being engaged with the engaging hole of the magnet member, and
wherein when the operating member is rotated, the magnet member rotates with the operating member.

7. A rotary switch comprising:
an operating member that is operable from outside of a case to move to a first position and a second position in an axial direction and is rotatable, wherein an engaging section having a non-circular cross-sectional shape is formed in a predetermined area of the operating member;
a magnet member having an engaging hole formed therein into which the engaging section of the operating member is inserted, wherein the magnet member is provided in such a manner that the magnet member does not move in the axial direction of the operating member;
a magnetic sensor that detects rotation of the magnet member;
a switch lever that rotates when the operating member is moved in the axial direction; and
a contact point section that comes into contact with the switch lever when the operating member is in the second position,
wherein when the operating member is moved in the axial direction, the engaging section of the operating member moves inside the engaging hole of the magnet member with the engaging section of the operating member being engaged with the engaging hole of the magnet member, and
wherein when the operating member is rotated, the magnet member rotates with the operating member.

8. The rotary switch according to claim 7, wherein the magnetic sensor is turned ON only when the operating member is in the second position and the switch lever is in contact with the contact point section.

9. An electronic timepiece comprising:
an operating member that is provided in a through-hole of a timepiece case so as to be operable to move to a first position and a second position in an axial direction and so as to be rotatable, wherein an engaging section having a non-circular cross-sectional shape is formed in a predetermined area of the operating member;
a magnet member comprising a ring-shaped magnet and a resin section that covers the ring-shaped magnet, wherein the magnet member as a whole has a substantially circular plate shape, wherein at an inside of the magnet member the resin section has an engaging hole formed therein which has a non-circular cross-sectional shape and into which the engaging section having the non-circular cross-sectional shape of the operating member is inserted, and wherein the magnet member is disposed inside the timepiece case in such a manner that the magnet member does not move in the axial direction of the operating member; and
a magnetic sensor that detects rotation of the magnet member,
wherein when the operating member is moved in the axial direction, the engaging section of the operating member moves inside the engaging hole of the magnet member with the engaging section of the operating member being engaged with the engaging hole of the magnet member, and
wherein when the operating member is rotated, the magnet member rotates with the operating member.

10. The electronic timepiece according to claim 9, wherein the magnetic sensor is provided on a printed circuit board provided inside the case, and corresponds to the magnet member with the printed circuit board being interposed therebetween.

11. The electronic timepiece according to claim 10, wherein a wiring pattern is not formed on the printed circuit board in an area between the magnet member and the magnetic sensor.

12. The electronic timepiece according to claim 9, wherein the magnetic sensor includes a pair of magnetic detecting elements and determines a rotation direction of the operating member based on an output from the pair of magnetic detecting elements.

13. The electronic timepiece according to claim 9, wherein the magnetic sensor is covered by a magnetic shield plate made of a magnetic material.

14. The electronic timepiece according to claim 9, further comprising:
a minute hand;
an hour hand; and
a movement for driving the hands.

15. An electronic timepiece comprising:
an operating member that is provided in a through-hole of a timepiece case so as to be operable to move to a first position and a second position in an axial direction and so as to be rotatable, wherein an engaging section having a non-circular cross-sectional shape is formed in a predetermined area of the operating member;
a main plate to which the operating member is attached such that the operating member is movable in the axial direction and is rotatable;
a magnet member having an engaging hole formed therein into which the engaging section of the operating member is inserted, wherein the magnet member is provided on the main plate in such a manner that the magnet member does not move in the axial direction of the operating member; and
a magnetic sensor that detects rotation of the magnet member,
wherein when the operating member is moved in the axial direction, the engaging section of the operating member moves inside the engaging hole of the magnet member with the engaging section of the operating member being engaged with the engaging hole of the magnet member, and
wherein when the operating member is rotated, the magnet member rotates with the operating member.

16. An electronic timepiece comprising:
an operating member that is provided in a through-hole of a timepiece case so as to be operable to move to a first position and a second position in an axial direction and so as to be rotatable, wherein an engaging section having a non-circular cross-sectional shape is formed in a predetermined area of the operating member;
a magnet member having an engaging hole formed therein into which the engaging section of the operating member is inserted, wherein the magnet member is disposed inside the timepiece case in such a manner that the magnet member does not move in the axial direction of the operating member; and
a magnetic sensor that detects rotation of the magnet member,
wherein the operating member is inserted into the through-hole from an outer side of the timepiece case, and inserted into the engaging hole which is provided in a resin section of a resin member of the magnet member disposed inside the timepiece case,
wherein when the operating member is moved in the axial direction, the engaging section of the operating member moves inside the engaging hole of the magnet member with the engaging section of the operating member being engaged with the engaging hole of the magnet member, and
wherein when the operating member is rotated, the magnet member rotates with the operating member.

17. An electronic timepiece comprising:
an operating member that is provided in a through-hole of a timepiece case so as to be operable to move to a first position and a second position in an axial direction and so as to be rotatable, wherein an engaging section having a non-circular cross-sectional shape is formed in a predetermined area of the operating member;
a magnet member having an engaging hole formed therein into which the engaging section of the operating member is inserted, wherein the magnet member is disposed inside the timepiece case in such a manner that the magnet member does not move in the axial direction of the operating member;
a magnetic sensor that detects rotation of the magnet member;
a switch lever that rotates when the operating member is moved in the axial direction; and
a contact point section that comes into contact with the switch lever when the operating member is in the second position,
wherein when the operating member is moved in the axial direction, the engaging section of the operating member moves inside the engaging hole of the magnet member with the engaging section of the operating member being engaged with the engaging hole of the magnet member, and
wherein when the operating member is rotated, the magnet member rotates with the operating member.

18. The electronic timepiece according to claim 17, wherein the magnetic sensor is turned ON only when the operating member is in the second position and the switch lever is in contact with the contact point section.

* * * * *